(12) United States Patent
Kawai

(10) Patent No.: US 7,145,806 B2
(45) Date of Patent: Dec. 5, 2006

(54) SEMICONDUCTOR MEMORY DEVICE AND METHOD OF CONTROLLING WRITE SEQUENCE THEREOF

(75) Inventor: Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/058,298

(22) Filed: Feb. 16, 2005

(65) Prior Publication Data

US 2006/0018162 A1 Jan. 26, 2006

(30) Foreign Application Priority Data

Jul. 20, 2004 (JP) .............................. 2004-211329

(51) Int. Cl.
*G11C 16/06* (2006.01)
(52) U.S. Cl. ........................... 365/185.25; 365/185.22; 365/185.17
(58) Field of Classification Search ........... 365/185.25, 365/185.22, 185.17, 203
See application file for complete search history.

(56) References Cited

U.S. PATENT DOCUMENTS 6,128,229 A * 10/2000 Nobukata .............. 365/185.22

FOREIGN PATENT DOCUMENTS

JP 2002-133888 5/2002

* cited by examiner

*Primary Examiner*—David Lam
(74) *Attorney, Agent, or Firm*—Oblon, Spivak, McClelland, Maier & Neustadt, P.C.

(57) ABSTRACT

A semiconductor memory device includes: a memory cell array having a plurality of word lines and a plurality of bit lines, which cross each other, and electrically rewritable and non-volatile memory cells disposed at crossings thereof; a read/write circuit configured to write data into a selected memory cell with applying a write voltage to a selected word line, and detect a discharge state of a selected bit line to read data of the selected memory cell after having precharged the selected bit line to a certain voltage; and a controller configured to control the read/write circuit to execute a write sequence by repeat of a write operation and a verify-read operation for the selected memory cell in such a way as to start a precharge operation of the selected bit line for the verify-read operation prior to the ending time of the write operation in the write sequence.

19 Claims, 11 Drawing Sheets

SEMICONDUCTOR MEMORY DEVICE AND METHOD OF CONTROLLING WRITE SEQUENCE THEREOF

CROSS-REFERENCE TO RELATED APPLICATION

This application is based on and claims the benefit of priority from the prior Japanese Patent Application No. 2004-211329, filed on Jul. 20, 2004, the entire contents of which are incorporated herein by reference.

BACKGROUND OF THE INVENTION

1. Field of the Invention

This invention relates to a semiconductor memory device, especially relates to a memory device, in which write sequence is controlled with a verify-read operation.

2. Description of Related Art

A flash memory, which is one of electrically rewritable and non-volatile semiconductor memory devices (EE-PROMs), stores data in a non-volatile manner in accordance with charge storing states of a charge storing layer (e.g., floating gate) of a memory cell. For example, the device stores binary data in such a manner that a low threshold voltage state (usually, a negative threshold voltage state) of a memory cell is defined as data "1", which is obtained by releasing electrons of the floating gate, while a high threshold voltage state (usually, a positive threshold voltage state) is defined as data "0", which is obtained by injecting electrons into the floating gate.

A NAND-type flash memory is known as one of flash memories. The NAND-type flash memory may be formed to have a large memory capacity because plural memory cells are connected in series in a manner that adjacent two memory cells share a source/drain diffusion layer.

To further increase the capacity of the flash memory device, a multi-value storage scheme, in which a memory cell stores multi bits, is used. For example, in a four-value storage flash memory, in which two bits are stored in a memory cell, one of "11", "10", "01" and "00" data, which are defined as being arranged in order of threshold voltage height, will be written.

Data write of the flash memory is performed with applying a write voltage, which is necessary for causing electron injection into a floating gate of a selected memory cell. To set the written threshold voltages of memory cells within a certain range, it is required to repeat a write voltage application and a write-verify for verifying the written state. Further, with increasing the write voltage by a small voltage step for each write cycle, it becomes possible to precisely control the written threshold voltage.

It has been achieved a substantially high-rate data write in the NAND-type flash memory by use of a scheme that data write is done by a page. At a write time of the NAND-type flash memory, a write voltage Vpgm is applied to a selected word line corresponding to a selected page in a selected block; and a write pass voltage Vpass to at least unselected (i.e., non-selected) word line(s) located on the bit line side, which is possible to turn on memory cells without regard to cell data, but insufficient for causing electron injection into unselected memory cells. At a write-verify time, a verify-read voltage Vvp is applied to the selected word line; and a read pass voltage Vread to unselected word lines, which turns on the unselected memory cells without regard to cell data.

As described above, it is required of a flash memory to execute plural write cycles in order to achieve certain data threshold distributions, and this fact puts a basic restriction on further improving the high-rate write performance of the flash memory.

There has been provided one approach, for further improving the high-rate write performance of the flash memory, as to shorten the write-verify time in consideration of the pass voltage applied to unselected word lines in the write-verify time (e.g., refer to Published and Unexamined Japanese Patent Application No. 2002-133888).

The write-verify read of the flash memory is, as similar to the ordinary read, done as to detect a discharge state of a bit line, which has been precharged to a certain voltage, thereby judging data. Bit line capacitance becomes larger as the memory cell array is more miniaturized and capacity thereof is more increased. This results in that it takes a long time for charging up the bit line, and it is difficult to shorten the write-verify time. Power consumption of the flash memory is usually defined in the specifications, and this also prevents the write-verify from being shortened.

SUMMARY OF THE INVENTION

According to an aspect of the present invention, there is provided a semiconductor memory device including:

a memory cell array having a plurality of word lines and a plurality of bit lines, which cross each other, and electrically rewritable and non-volatile memory cells disposed at crossings thereof;

a read/write circuit configured to write data into a selected memory cell with applying a write voltage to a selected word line, and detect a discharge state of a selected bit line to read data of the selected memory cell after having precharged the selected bit line to a certain voltage; and a controller configured to control the read/write circuit to execute a write sequence by repeat of a write operation and a verify-read operation for the selected memory cell in such a way as to start a precharge operation of the selected bit line for the verify-read operation prior to the ending time of the write operation in the write sequence.

DETAILED DESCRIPTION OF THE EMBODIMENTS

Illustrative embodiments of this invention will be explained with reference to the accompanying drawings below.

Figure 1:
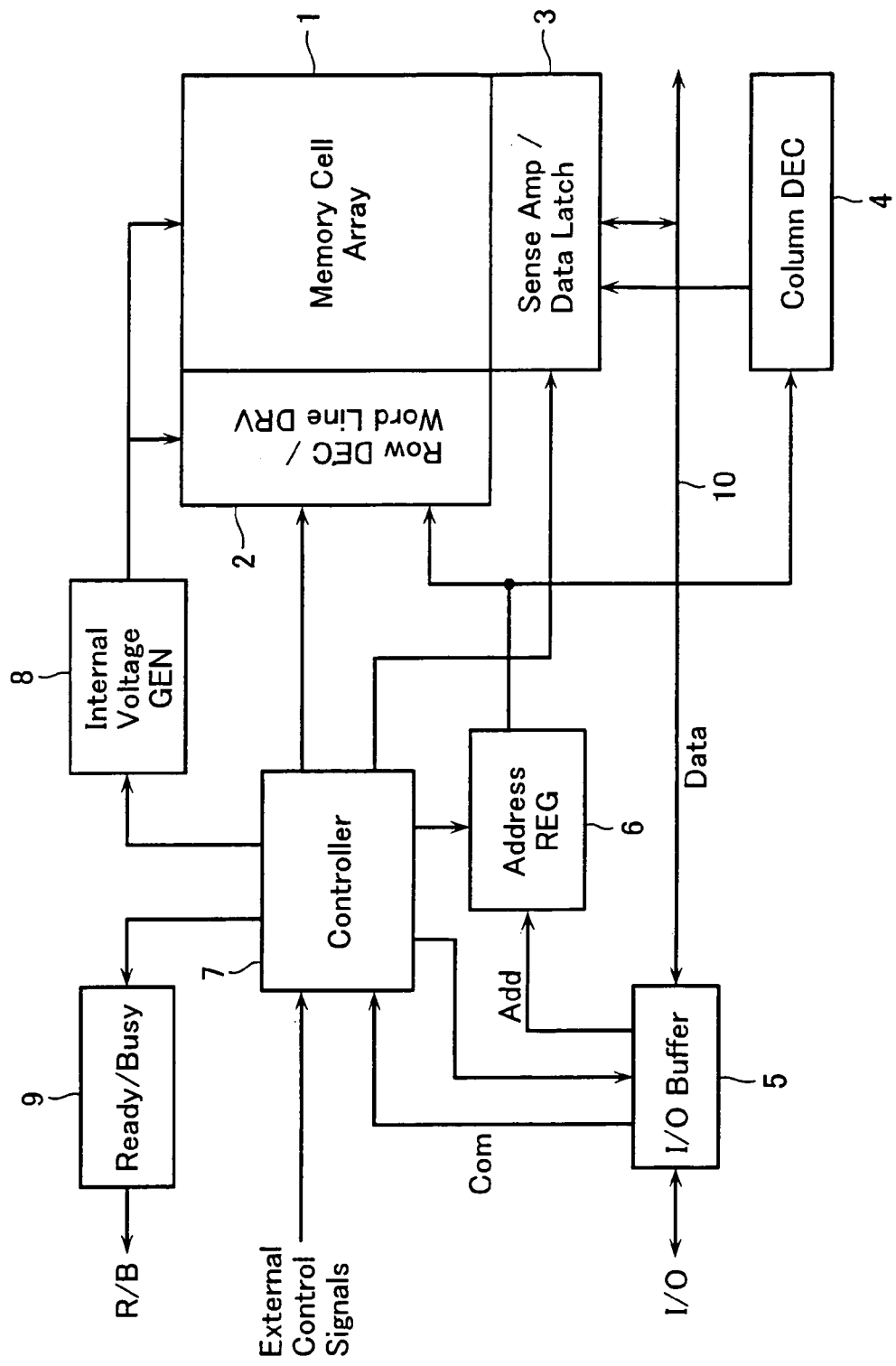
FIG. 1 shows a functional block of a flash memory in accordance with an embodiment of the present invention.
Figure 2:
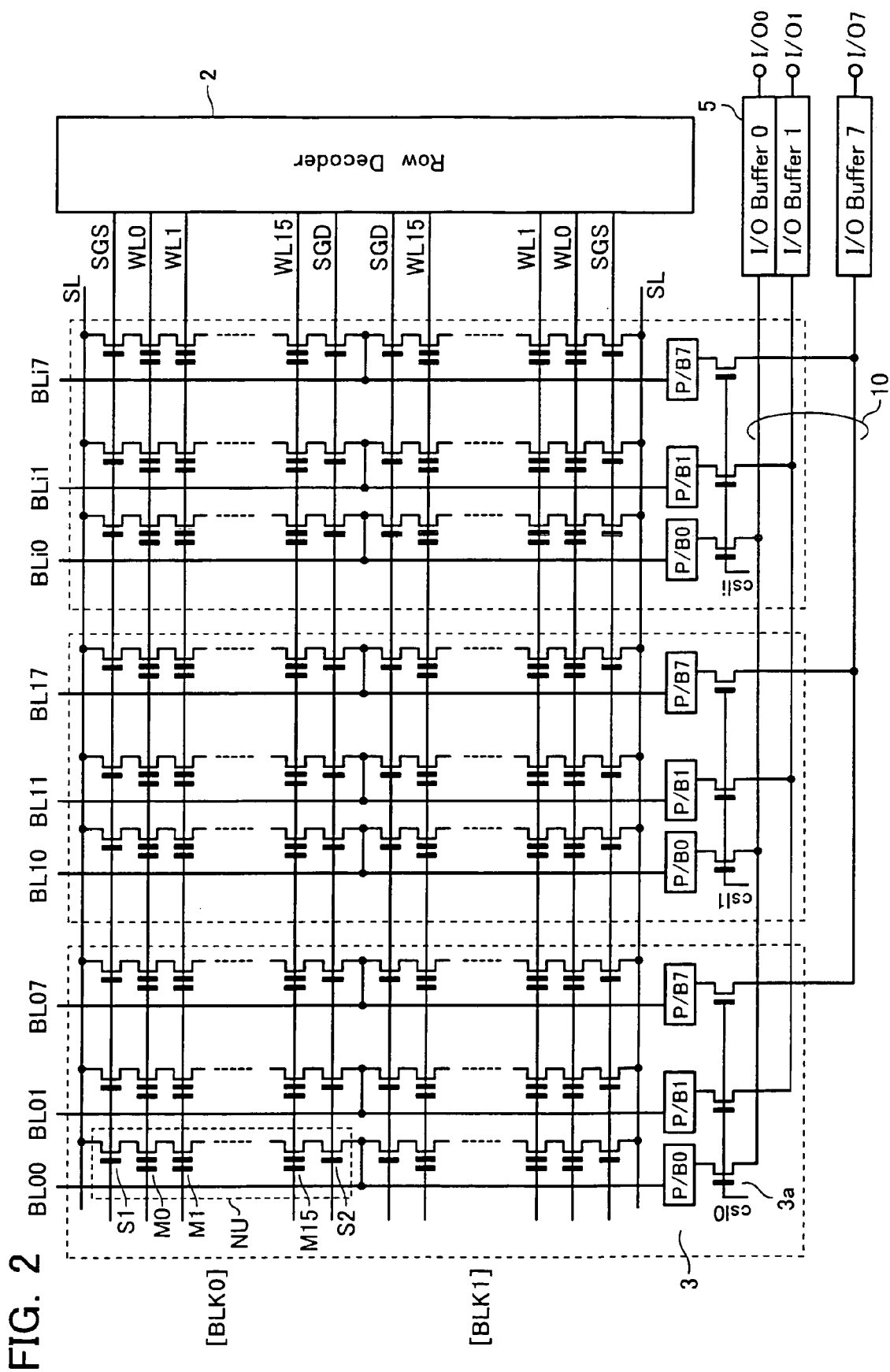
FIG. 2 shows an arrangement of a memory cell array of the flash memory.

FIG. 1 shows a block diagram of a NAND-type flash memory, and FIG. 2 shows a memory cell array 1 formed therein. The memory cell array 1 is formed of NAND cell units NU arranged in a matrix manner. Each NAND cell unit NU is constituted by electrically rewritable and non-volatile memory cells (sixteen cells in this case) M0–M15 connected in series, and select gate transistors S1 and S2 for connecting both ends thereof to a source line SL and a bit line BL, respectively.

Control gates of the memory cells in a NAND cell unit NU are coupled to different word lines WL0–WL15, respectively. Gates of the select gate transistors S1 and S2 are coupled to select gate lines SGS and SGD, respectively.

A set of plural NAND cell units sharing a word line constitutes a block BLK serving as a unit of data erase. As shown in FIG. 2, plural blocks (BLK0, BLK1, . . . ) are disposed in the direction of the bit line BL. A set of memory cells sharing a word line constitutes a page or two pages.

A row decoder 2 is disposed to selectively drive word lines and select gate lines in accordance with a row address, which includes word line drivers. A sense amplifier 3 is disposed to be connected to bit lines for reading data by a page, and to serve as a data latch for holding one page write data. That is, data read and data write are performed by a page.

It should be noted that the row decoder 2 and sense amplifier circuit 3 constitute a read/write circuit, which performs data write and read (including verify-read after writing) of the memory cell array 1.

Data transmitting/receiving between the sense amplifier circuit 3 and external input/output terminals I/O is done via I/O buffer 5 and a data bus 10. The sense amplifier circuit 3 has, as shown in FIG. 2, one page sense amplifiers P/B and a 20 column gate 3a, which is controlled by column select signals CSLi, is attached thereto. A column decoder 4 controls this column gate 3a. Suppose that eight I/O terminals (I/O0–I/O7) are prepared, based on the above-described column control, data are serially transferred by a byte between the sense amplifier circuit 3 and I/O terminals.

Address "Add" supplied via I/I terminals is row decoder 2 and column decoder 4 via an address resister 6. Command "Com" supplied via I/O terminals is decoded in a controller 7. The controller 7 executes data write and erase sequence controls and a data read control in response to external control signals and commands.

An internal voltage generating circuit 8 serves for generating various voltages necessary for write, erase and read operation modes. For generating voltages higher than a power supply voltage, it is formed of boost circuits. A status register 9 is prepared to output a status signal R/B to exterior, which designates whether the chip is in a ready state for data reading or writing or in a busy state.

Figure 3:
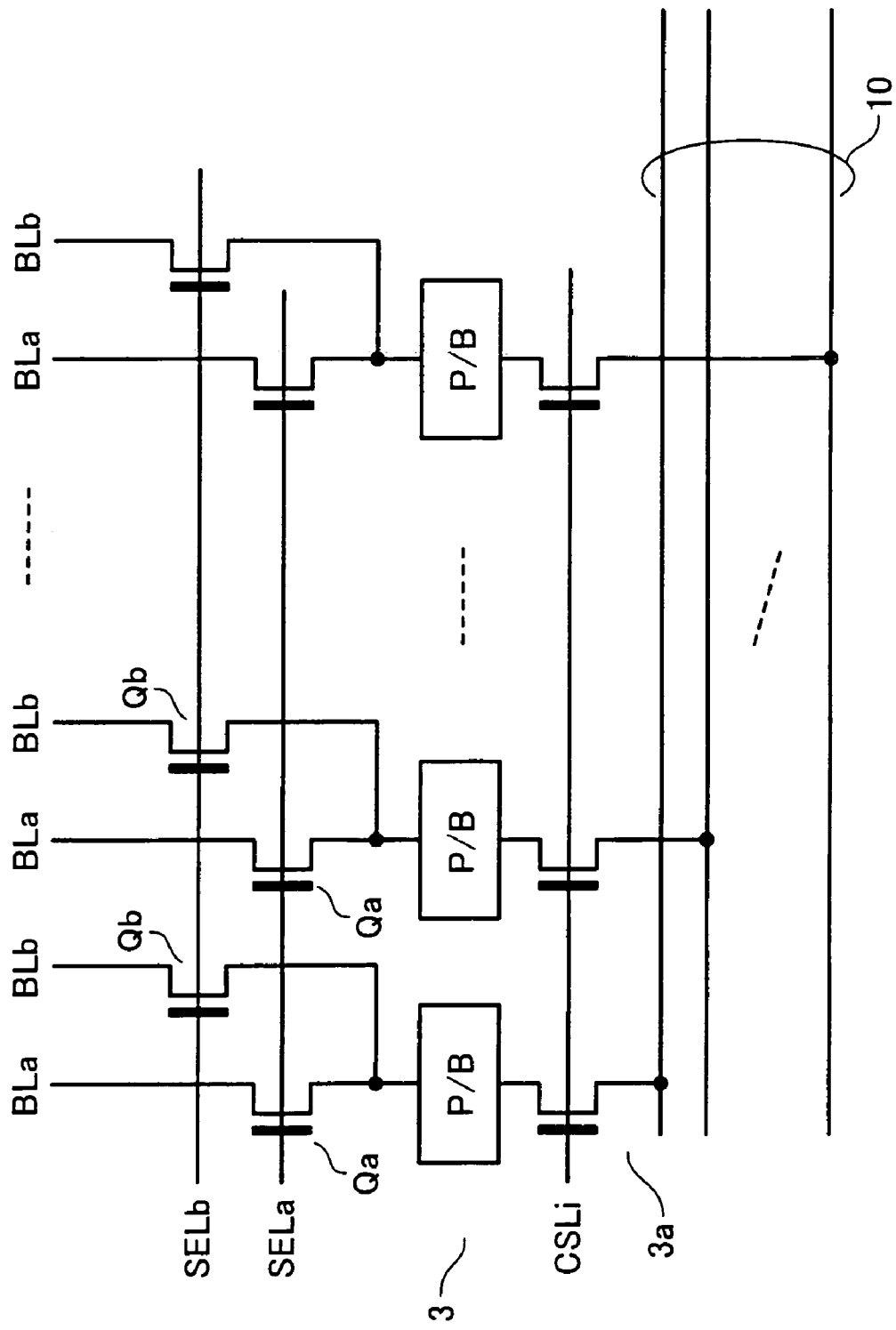
FIG. 3 shows a preferable configuration of bit lines of the flash memory.

Although FIG. 2 shows a case where sense amplifiers P/B are disposed for the respective bit lines BL, it is not easy to arrange the sense amplifiers for the respective bit line pitches one by one when the memory cell array 1 is miniaturized. By this reason, as shown in FIG. 3, it is usually used a scheme that adjacent two bit lines share a sense amplifier. Odd bit lines BLa and even bit line BLb are selectively coupled to the sense amplifiers P/B via bit line select transistors Qa and Qb which are selectively turned on.

In case the sense amplifier circuit scheme shown in FIG. 3 is utilized, a set of memory cells arranged along a word line is divided into two pages. That is, one page is constituted by memory cells disposed at crossings between a word line and odd bit lines; and the other page is constituted by memory cells disposed at crossings between the word line and even bit lines.

Figure 4:
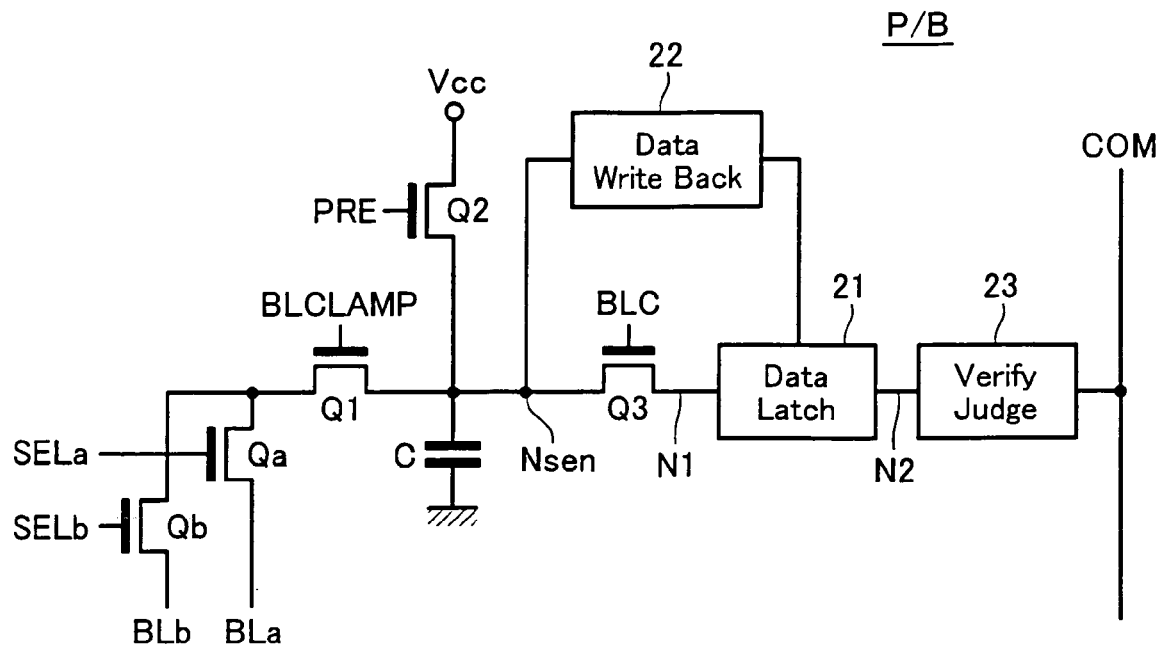
FIG. 4 shows a configuration of a sense amplifier circuit of the flash memory.

FIG. 4 shows a configuration of a sense amplifier P/B. A sense node Nsen is selectively coupled to bit line BLa or BLb via a clamping NMOS transistor Q1 and bit line select transistor Qa or Qb. The clamping transistor Q1 serves for clamping the bit line voltage and serves as a pre-sense amplifier for detecting bit line voltage.

Connected to the sense node Nsen are precharging NMOS transistor Q2, which serves for precharging the bit line and sense node Nsen, and charge holding capacitor C. A data latch 21 is to hold read out data or write data, one data node N1 of which is coupled to the sense node Nsen via a transferring NMOS transistor Q3.

A data storage circuit 22 is disposed for temporarily store a write data, which is loaded into the data latch 21 at a data write time. Data write is, as described later, performed with plural write cycles each defined by a write voltage application operation and the following write-verify operation. The data storage circuit 22 stores write data in the last cycle, and serves as a write back circuit for writing back next write data bit to the sense node Nsen in accordance with the result of verify-read for each write data bit.

Connected to the other data node N2 of data latch 21 is a verify-judge circuit 23. A judge signal line COM connected to this verify-judge circuit 23 is disposed common to the entire sense amplifiers of one page. When the entire write data bits are normally written, data latches 21 of the entire sense amplifiers will be controlled to be in an all "1" data state (e.g., all "H" or all "L" state at data nodes N2) in a verify-read. The verify-judge circuit 23 detects this state at a verify judge time to output a write completion signal to the signal line COM.

Figure 5:
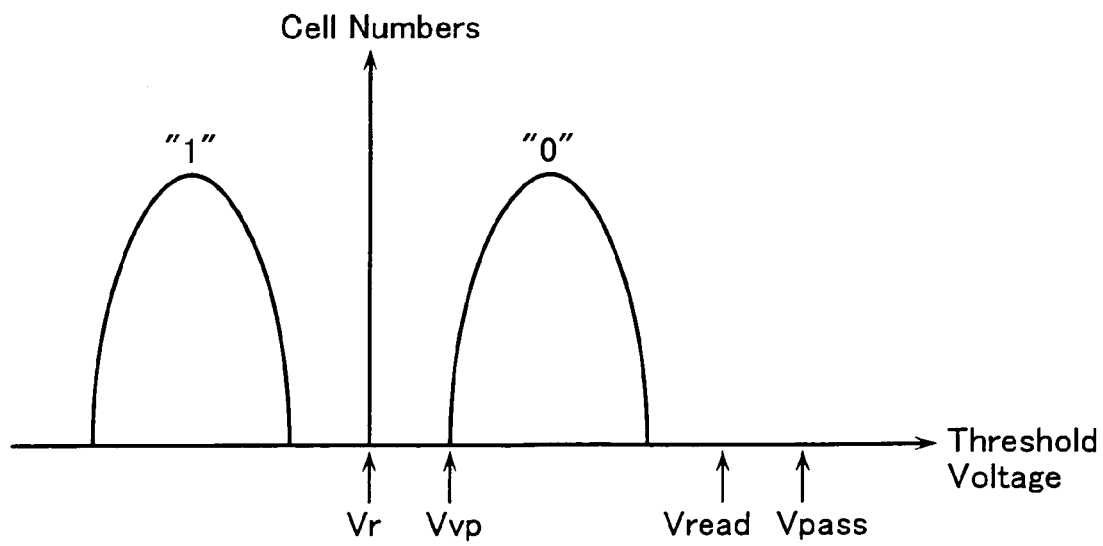
FIG. 5 shows binary data threshold voltage distributions of binary data of the flash memory.

In case of binary data storing, the data threshold voltage distributions will be expressed as shown in FIG. 5. That is, binary data is stored as logic "1" data defined by a low threshold voltage state (i.e., negative threshold voltage state) of a memory cell, or logic "0" data defined by a high threshold voltage state (i.e., positive threshold voltage state). "1" data is a state where electrons have been discharged from a floating gate of a memory cell, and it is defined as "erase" or "erasure" in a narrow sense that an operation for obtaining this data state. "0" data is a state where electrons have been injected into the floating gate, and it is defined as "write" in a narrow sense that an operation for obtaining this state.

Figure 6:
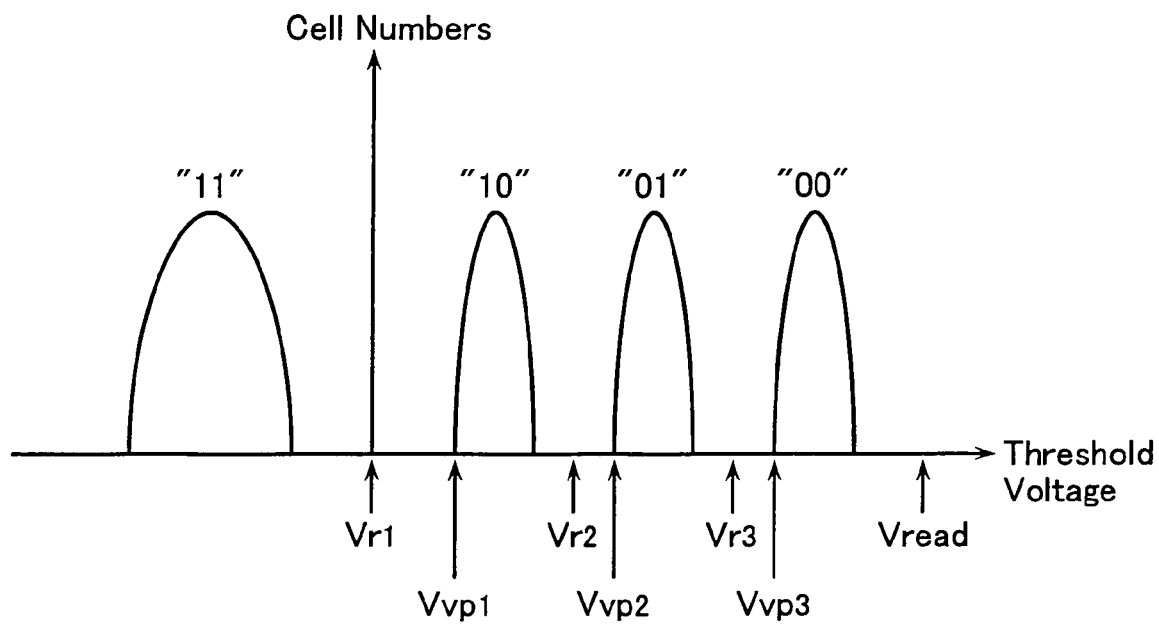
FIG. 6 shows four-value data threshold voltage distributions of the flash memory.

In case of four-value data storing, the data threshold distributions are expressed as shown in FIG. 6, to which the combinations of upper bit "x" and lower bit "y" are assigned. The lowest threshold voltage (i.e., negative threshold state) is defined as data "11" (i.e., erase state). The remaining three threshold voltage states are defined as data "10", "01" and "00" in order of threshold voltage height.

Hereinafter, the binary data storing case will be mainly explained. Data read is performed by a page. At a data read time, the select gate transistors are tuned on; a selected word line in a selected block is applied with a read voltage Vr (e.g., 0V) as shown in FIG. 5; and unselected word lines (i.e., non-selected word lines) are applied with a pass voltage Vread that turns on memory cells without regard to cell data. In case the selected memory cell's data is "1", a read current flows through the NAND cell channel, while in case the selected memory cell's data is "0", such the read current does not flow. Therefore, detect the read current with the sense amplifier circuit 3, and it may be judged data.

In a practical data read, clamping transistor Q1 and precharging transistor Q2 are turned on prior to coupling the NAND cell channel to the bit line so that the bit line is precharged. After having precharged the bit bile, turn on the select gate transistor, and detect whether the bit line is discharged or not after a certain waiting time, data "0" or "1" will be decided.

Data write also is performed by a page. In accordance with data "0" and "1" of a page write data loaded in the sense amplifier circuit 3, write control voltages are applied to the corresponding bit lines so as to charge the NAND cell channels. In detail, the NAND cell channel(s), to which "0" data is applied, is set at Vss (=0V), while the remaining NAND cell channel(s), to which "1" is applied, is charged up to Vcc-Vth (Vth: threshold voltage of the select gate transistor) and becomes floating.

At this state, apply a write voltage Vpgm to a selected word line in a selected block; and apply a write pass voltage Vpass to unselected word line(s) located at least bit line side, which turns on memory cells without regard to cell data, but is insufficient for causing electron injection, as shown in FIG. 5. With this voltage application, electrons are injected into the floating gate of the "0" write memory cell by FN tunneling. In contrast, the "1" write memory cell (write inhibiting cell) is kept in the "1" data state because electron injection into the floating gate is not occurred.

Figure 7:
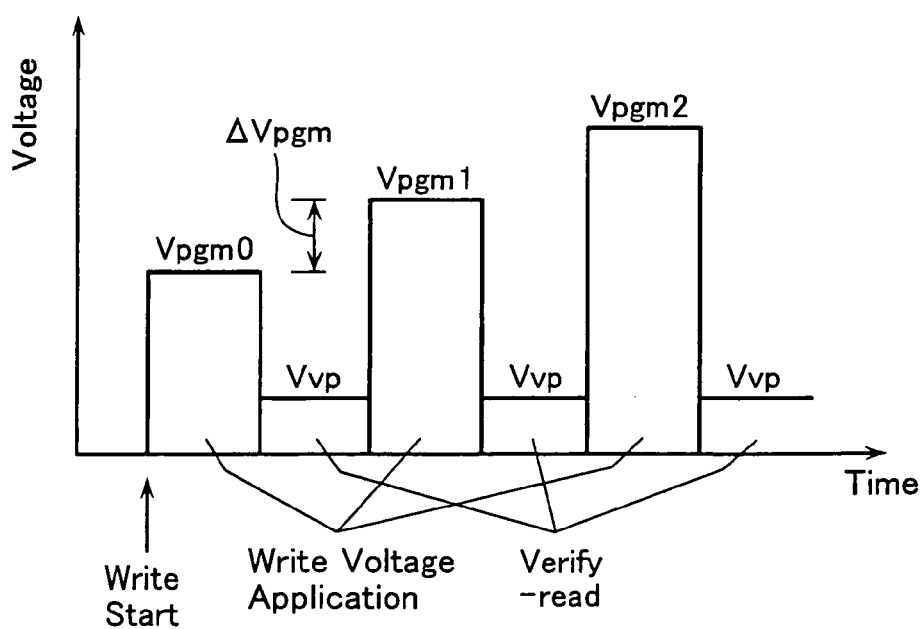
FIG. 7 shows a data write sequence of the flash memory.

Practical data write is, as shown in FIG. 7, performed with a plurality of write cycles each including voltage application and the following verify-read. The write voltage Vpgm will be stepped up in order by ΔVpgm as shown in FIG. 7.

The verify-read is basically the same as ordinary read, but it's read voltage (judging voltage) is set at the lower limit Vvp of the "0" data threshold distribution as shown in FIG. 5. With this read voltage, it may be judged whether the threshold voltage of "0" data has reached Vvp or not.

In this embodiment, to achieve a high-speed data write, a bit line precharge time for write-verify is partially overlapped to a write time, whereby a write-verify time will be shortened in appearance. A detailed write sequence in accordance with this embodiment will be described bellow.

Figure 8:
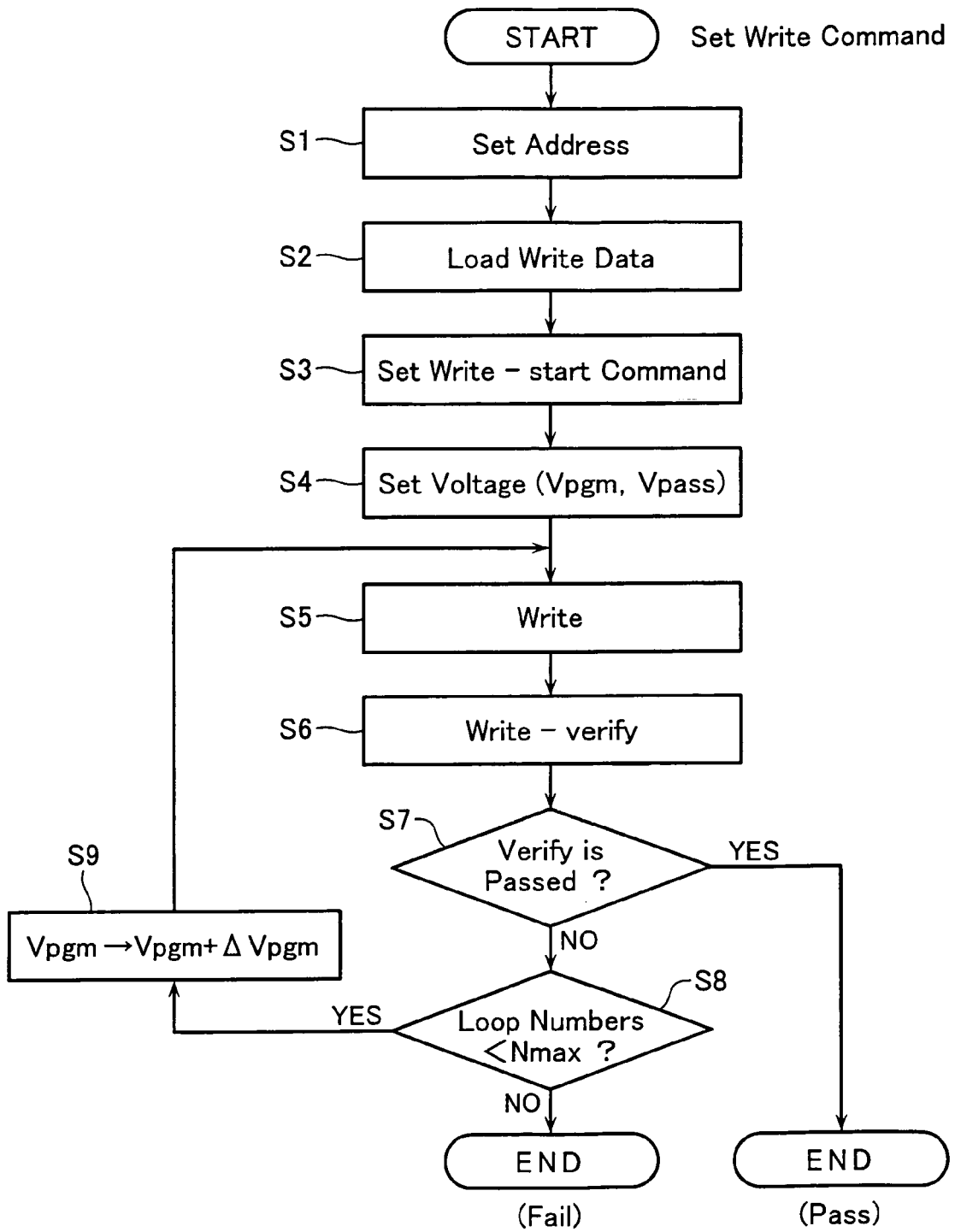
FIG. 8 shows a control flow chart of data write of the flash memory.

FIG. 8 shows a data write sequence controlled by the controller 7. As a write command is input and set in the controller 7, data write starts. Following it, as address data is input, the controller 7 sets it in the address register 6 (at step S1). As write data are input, those are transferred to and loaded in the sense amplifier circuit 3 (at step S2). AS described above, the write data of one page are serially transferred by a byte and loaded in the sense amplifier circuit 3.

After having loaded the write data, the controller 7 receives a write-start command (at step S3) to automatically execute write sequence control. Initially, various internal voltages, such as write voltage Vpgm, pass voltage Vpass and the like necessary for data write, are set (at step S4). Following it, a write operation is performed (at step S5), and then a write-verify operation is performed (at step S6).

Thereafter, verify-judgment is performed for judging whether the write-verify is passed or not (at step S7). If "YES" (i.e., PASS), a PASS flag is set, and the write sequence ends. If "NO", detect whether the number of write loops (i.e., write cycle numbers) has reached the maximum Nmax or not (at step S8). If the number of loops has not reached Nmax, step up the write voltage Vpgm (at step S9), and repeat the same write operation. In case the data write is not completed when the number of loops has reached Nmax, the data write ends after setting a FAIL flag.

Figure 9:
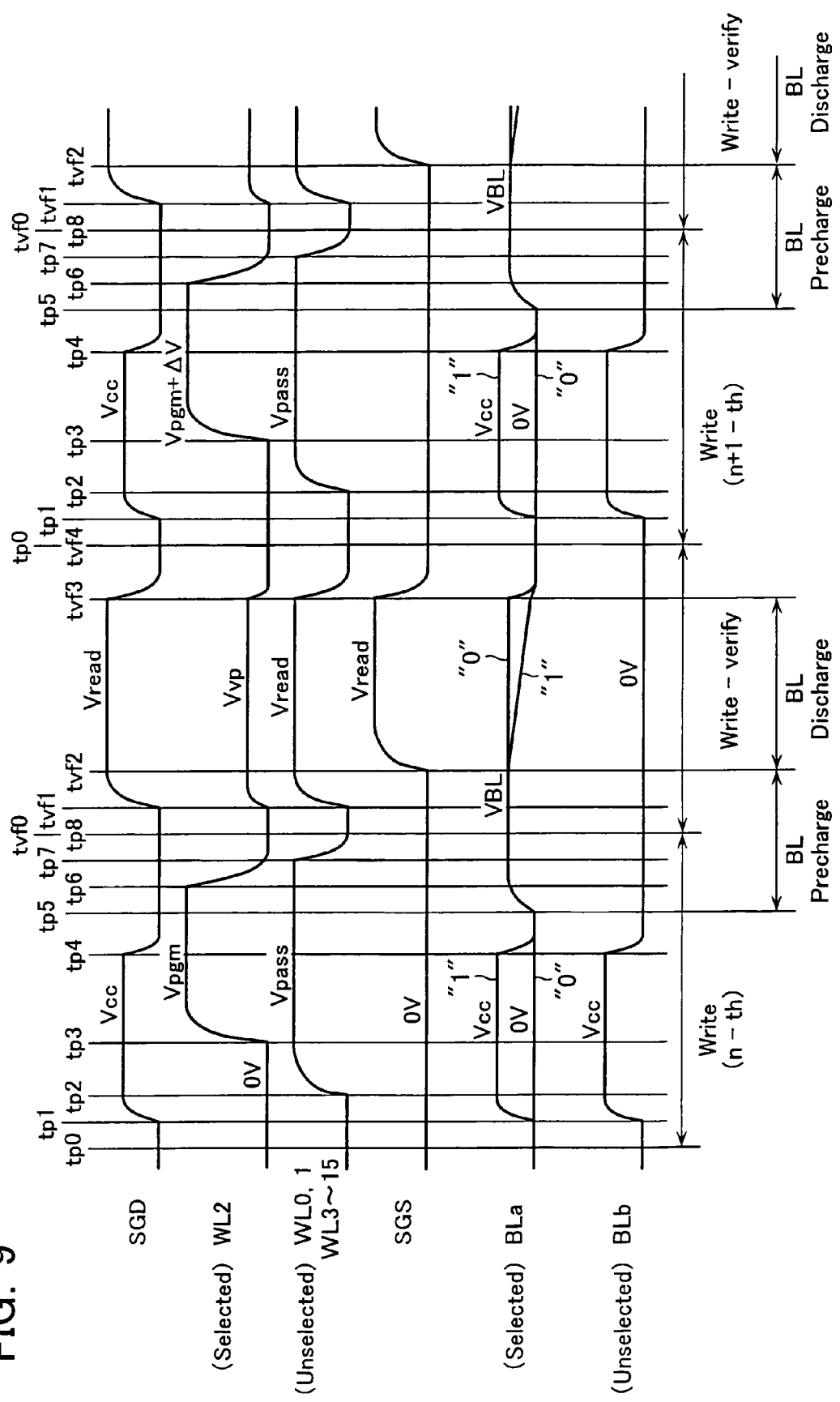
FIG. 9 shows a timing chart of data write of the flash memory.

FIG. 9 shows a timing chart of the write sequence. A period from timing tp0 to timing tp8 is defined as a write time period; and a period from timing tvf0 (=tp8) to timing tvf4 is defined as a write-verify time period. Following these, the same write cycle will be repeated. In this example, it is shown a case that a word line WL2 is selected in a block, and odd bit lines BLa are selected.

At a write time, the sense amplifier circuit 3 applies write control voltages to the selected bit lines BLa in accordance with write data "0" and "1". In detail, the write control voltages are set as follows: in case of "0" write, 0V is used as a write allowing voltage; and in case of "1" write, Vcc is used as a write inhibiting voltage. To unselected (non-selected) even bit lines BLb, the write inhibiting voltage, Vcc, is applied as similar to "1" write bit lines. Vcc is applied to the select gate line SGD of the selected block at timing tp1, and write pass voltage Vpass is applied to unselected word lines WL0, WL1 and WL3–15 at timing tp2, and then write voltage Vpgm is applied to the selected word line WL2 at timing tp3. The select gate line SGS located on the source line side is held at 0V.

With these voltage applications, in a selected memory cell(s), to which "0" data is supplied, electron injection into floating gate thereof occurs, i.e., "0" write is performed, while in an unselected cell(s), to which "1" data is supplied, electron injection does not occur.

Discharge the write voltage Vpgm of the selected word line WL2 at timing tp6, and the data write ends. In this embodiment, at timing tp4 prior to tp6, the select gate line SGD is discharged to turn of the select gate transistor, and simultaneously with it, bit lines BLa, BLb are discharged. And then a precharge operation of the selected bit lines BLa, which are isolated from NAND cell units, is started for verify-reading at timing tp5 prior to the selected word line discharge. Bit line precharge voltage, VBL, is defined by a voltage applied to the gate BLCLAMP of the clamping transistor Q1 of the sense amplifier P/B as to be set at a certain level usually lower than the power supply voltage Vcc. tp8(=tvf0) is a write ending timing, and also a write-verify stating timing. As describe above, in this embodiment, the bit line precharge operation for verify-reading is performed prior to this timing. Apply the pass voltage Vread to the select gate line SGD located on the bit line side and the unselected word lines at timing tvf1; and simultaneously with it, apply a verify-read voltage Vvp to the selected word line WL2; and then apply the pass voltage Vread to the select gate line SGS located on the source line side at timing tvf2, and the precharged bit lines BLa will be discharged in accordance with the selected memory cells' data. Within, a period from timing tvf2 to timing tvf3 while the bit line discharge operation continues, each the bit line discharge state is detected, i.e., data sense is performed.

After timing tvf3, a recovery operation for bit lines and word lines is performed. Such the write and write-verify operations are repeated until one page data write is completed, or until the write numbers reach the maximum value with verify judgment operations as described above.

As explained above, in this embodiment, the precharge operation of the selected bit lines for write-verifying is started prior to ending of the write operation. Therefore, in case it is supposed that the bit line precharge operation is included in the write-verify operation, the write-verify time is overlapped the write operation time that is to be ahead of the write-verify. As a result, it may be shortened the write-verify time in appearance, and it becomes possible to shorten the data write time of the flash memory.

In the example shown in FIG. 9, the bit lines BLa, BLb are discharged while the write voltage Vpgm is applied to the selected word line. Naturally, when resetting the bit lines, the select gate line SGD is discharged to turn off the select gate transistors located on the bit line side. However, if the select gate transistors are deteriorated in cut-off characteristics, there is a fear of erroneous writing into unselected memory cells coupled to the unselected bit lines BLb and "1" write memory cells coupled to the selected bit lines BLa.

Figure 10:
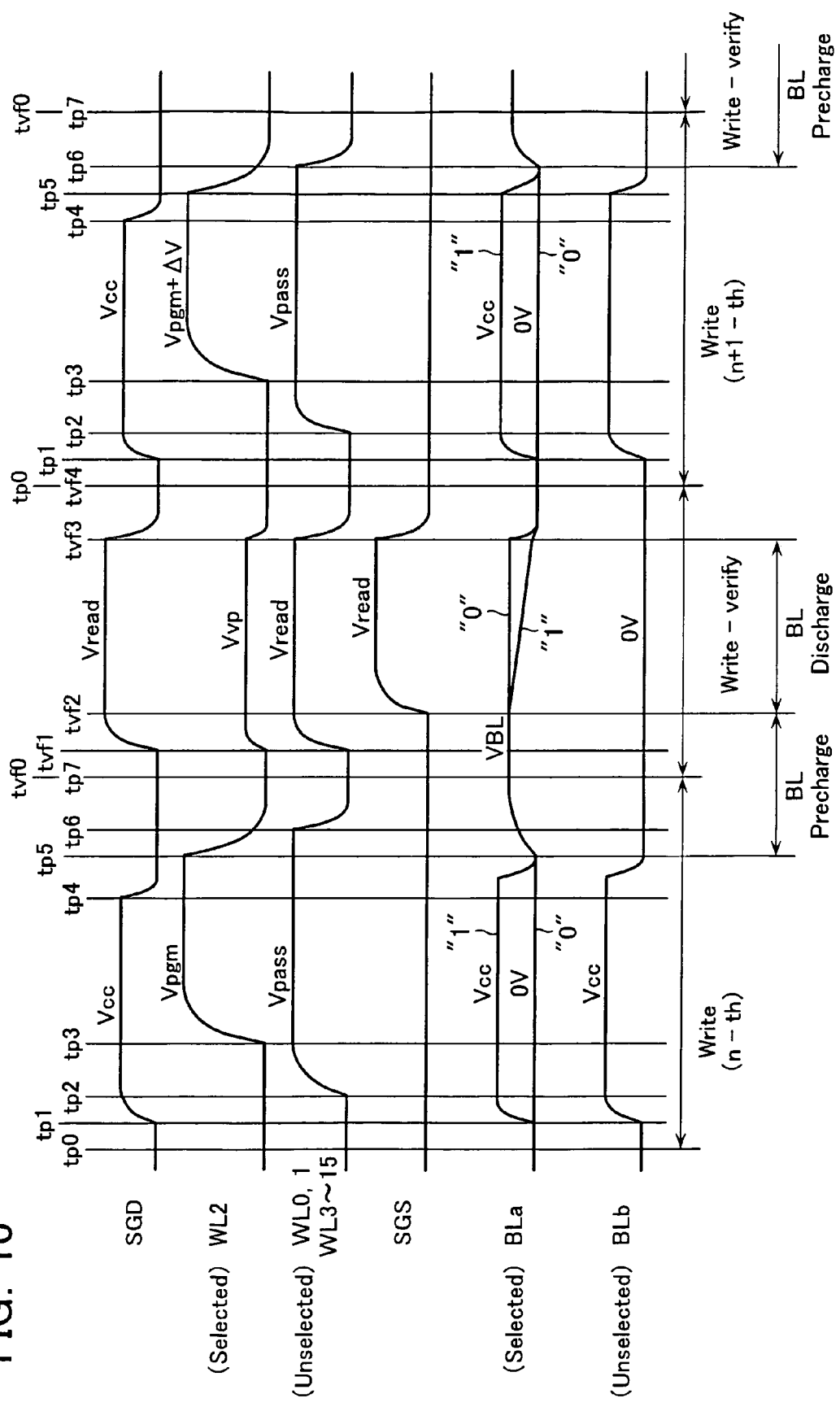
FIG. 10 shoes another timing chart of data write of the flash memory.

FIG. 10 shows a timing chart of another write sequence that is considered to prevent the memory from being erroneously written as described above. The detailed explanation of the basic sequence will be omitted because it is the same as that shown in FIG. 9.

Prior to voltage stepping down of the selected word line WL2, i.e., discharge starting (timing tp5), the select gate line SGD is stepped down in voltage at timing tp4. As delayed to it, the selected bit lines BLa and unselected bit lines BLb are discharged prior to the start point of discharging the selected word line WL2. Then the selected word line WL2 starts to be discharged at timing tp5, and the precharge operation of the selected bit lines BLa starts simultaneously. In other words, the precharge operation of the selected bit lines BLa for verifying and the discharge operation of the selected word line WL2 are simultaneously performed.

According to this sequence, it may be regarded as there is little period while the write voltage Vpgm is applied to the selected word line WL2 and the bit lines BLa and BLb are reset in voltage simultaneously. Therefore, even if the select gate transistors have been deteriorated a little in cut-off characteristics, there is no fear of erroneously writing into unselected memory cells and "1" writing ones. In addition, the bit line precharge operation starts after having substantially ended the write operation, but start timing thereof, tp5, is prior to the end timing of the write operation, tp7, defined on the sequence control. Therefore, it may be substantially shortened the write-verify time in comparison with the conventional one, and it becomes possible to shorten the total data write time of the flash memory.

As an embodiment, an electric card using the non-volatile semiconductor memory devices according to the above-described embodiments of the present invention and an electric device using the card will be described bellow.

Figure 11:
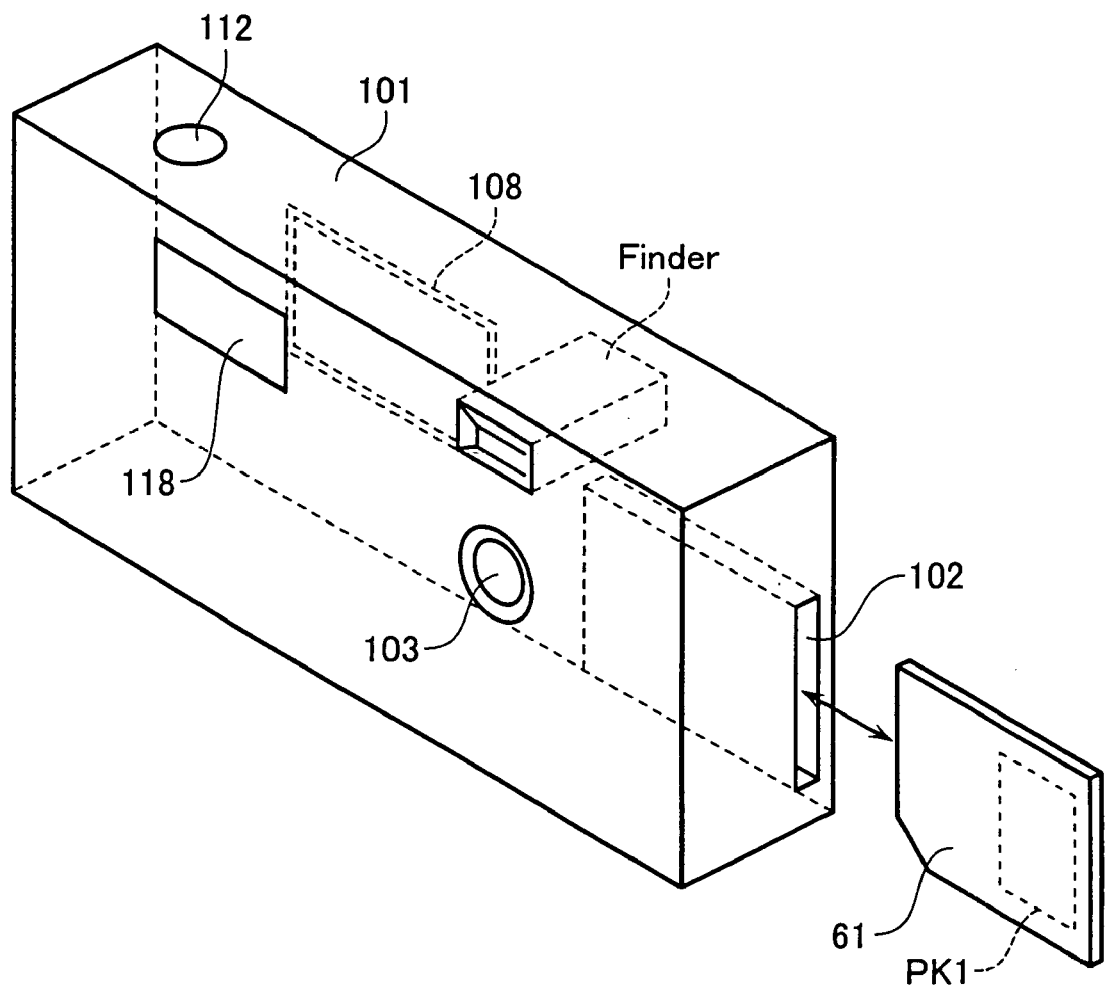
FIG. 11 shows another embodiment applied to a digital still camera.

FIG. 11 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 12:
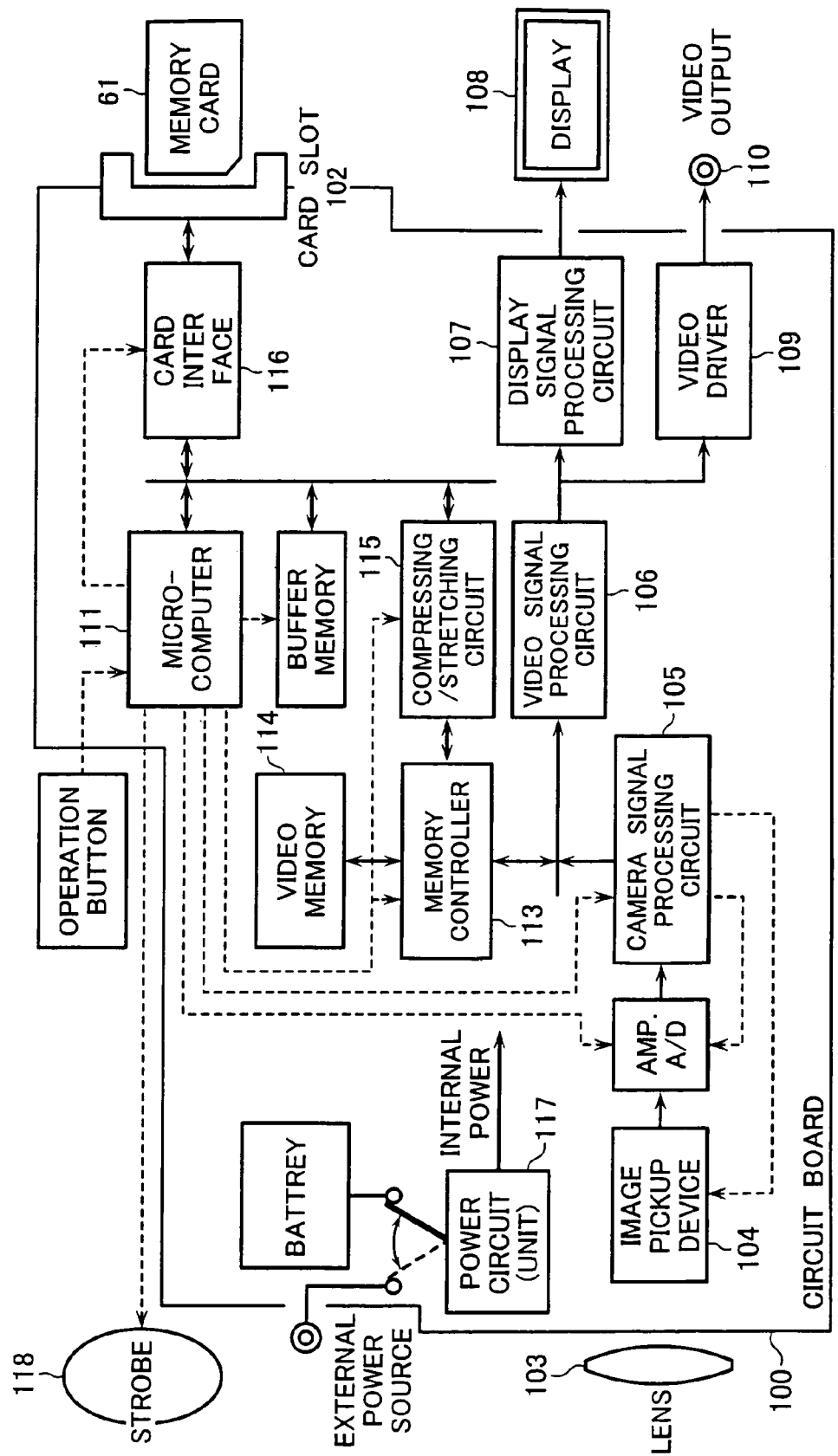
FIG. 12 shows the internal configuration of the digital still camera.
Figure 13A:
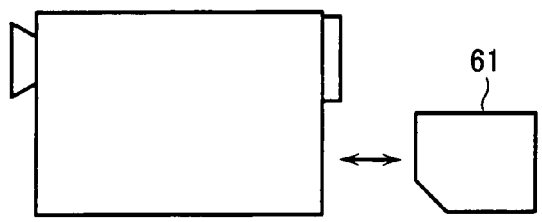
FIGS. 13A to 13J show other electric devices to which the embodiment is applied.
Figure 13F:
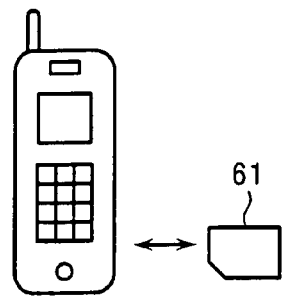
Figure 13B:
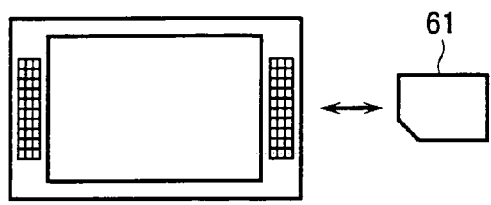
Figure 13G:
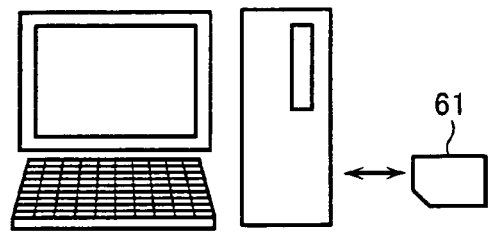
Figure 13C:
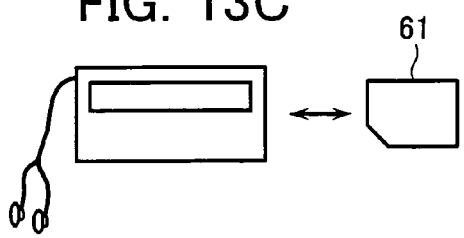
Figure 13H:
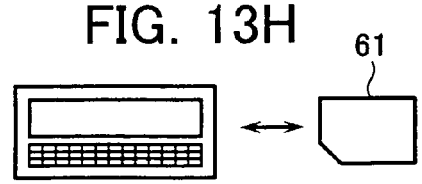
Figure 13D:
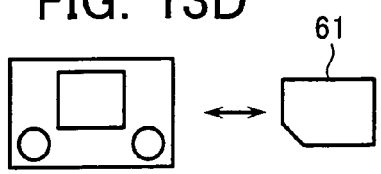
Figure 13I:
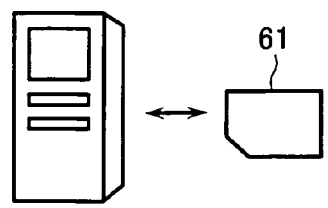
Figure 13E:
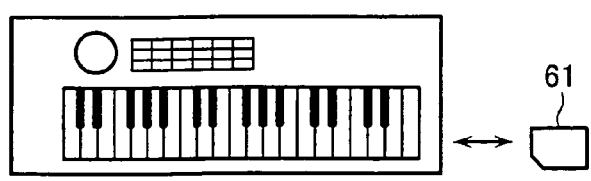
Figure 13J:
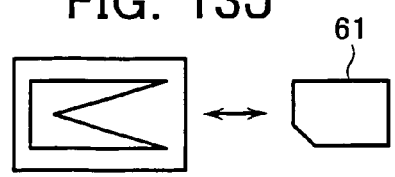

FIG. 12 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface. 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 13A to 13J, as well as in portable electric devices. That is, the electric card can also be used in a video camera shown in FIG. 13A, a television set shown in FIG. 13B, an audio apparatus shown in FIG. 13C, a game apparatus shown in FIG. 13D, an electric musical instrument shown in FIG. 13E, a cell phone shown in FIG. 13F, a personal computer shown in FIG. 13G, a personal digital assistant (PDA) shown in FIG. 13H, a voice recorder shown in FIG. 13I, and a PC card shown in FIG. 13J.

What is claimed is:

1. A semiconductor memory device comprising:
   a memory cell array having a plurality of word lines and a plurality of bit lines, which cross each other, and electrically rewritable and non-volatile memory cells disposed at crossings thereof;
   a read/write circuit configured to write data into a selected memory cell with applying a write voltage to a selected word line, and detect a discharge state of a selected bit line to read data of the selected memory cell after having precharged the selected bit line to a certain voltage; and
   a controller configured to control said read/write circuit to execute a write sequence by repeat of a write operation and a verify-read operation for the selected memory cell in such a way as to start a precharge operation of the selected bit line for the verify-read operation prior to the ending time of the write operation in the write sequence.

2. The semiconductor memory device according to claim 1, wherein,
   said memory cell array further includes select gate transistors disposed for coupling the memory cells to the corresponding bit lines, and wherein
   the write operation for the selected memory cell is performed with applying a write voltage to the selected word line while the select gate transistors are driven to be on, and wherein
   the precharge operation of the selected bit line for the verify-read operation is started after turning off the select gate transistors, and while the write voltage is applied to the selected word line.

3. The semiconductor memory device according to claim 1, wherein,
   said memory cell array further includes select gate transistors disposed for coupling the memory cells to the corresponding bit lines, and wherein
   the write operation for the selected memory cell is performed with: applying a write voltage to the selected word line while the select gate transistors are driven to be on; applying a write allowing voltage or write inhibiting voltage to the selected bit line in accordance with write data; and applying the write inhibiting voltage to a non-selected bit line, and wherein
   the precharge operation of the selected bit line for the verify-read operation is started after turning off the select gate transistors and simultaneously discharging the selected and non-selected bit lines, and while the write voltage is applied to the selected word line.

4. The semiconductor memory device according to claim 1, wherein
   said memory cell array further includes select gate transistors disposed for coupling the memory cells to the corresponding bit lines, and wherein
   the write operation for the selected memory cell is performed with applying a write voltage to the selected word line while the select gate transistors are driven to be on, and wherein
   the precharge operation of the selected bit line for the verify-read operation is started simultaneously with starting the discharge of the selected word line after turning off the select gate transistors.

5. The semiconductor memory device according to claim 1, wherein,
   said memory cell array further includes select gate transistors disposed for coupling the memory cells to the corresponding bit lines, and wherein
   the write operation for the selected memory cell is performed with applying a write voltage to the selected word line while the select gate transistors are driven to be on; applying a write allowing voltage or write inhibiting voltage to the selected bit line in accordance with write data; and applying the write inhibiting voltage to a non-selected bit line, and wherein
   the precharge operation of the selected bit line for the verify-read operation is started simultaneously with starting discharge of the selected word line after turning off the select gate transistors prior to the selected word line discharge, and after discharging the selected and non-selected bit lines just before starting discharge of the selected word line.

6. The semiconductor memory device according to claim 1, wherein
   said read/write circuit comprises:
   a row decoder configured to selectively drive the word lines in said memory cell array; and
   a sense amplifier circuit disposed to be coupled to the bit lines of said memory cell array so as to perform a data read operation, and hold write data therein, thereby applying control voltages to the bit lines in accordance with the write data.

7. The semiconductor memory device according to claim 1, wherein
   said memory cell array has a plurality of NAND cell units arranged therein, each NAND cell having: plural memory cells connected in series, control gates thereof being coupled to different word lines; a first select gate transistor disposed for coupling one end thereof to a bit line; and a second select gate transistor disposed for coupling the other end thereof to a source line.

8. The semiconductor memory device according to claim 7, wherein,
   the write operation for the selected memory cell is performed with applying a write voltage to the selected word line while the first and second select gate transistors are driven to be on and off, respectively; and applying a pass voltage to non-selected word lines, which turns-on memory cells without regard to cell data, and wherein
   the precharge operation of the selected bit line for the verify-read operation is started after turning off the first select gate transistor, and while the write voltage is applied to the selected word line.

9. The semiconductor memory device according to claim 7, wherein,
   the write operation for the selected memory cell is performed with applying a write voltage to the selected word line while the first and second select gate transistors are driven to be on and off, respectively; applying a write allowing voltage or write inhibiting voltage to the selected bit line in accordance with write data;

applying the write inhibiting voltage to non-selected bit lines; and applying a pass voltage to non-selected word lines, which turns on memory cells without regard to cell data, and wherein the precharge operation of the selected bit line for the verify-read operation is started after turning off the first select gate transistor and simultaneously discharging the selected and non-selected bit lines, and while the write voltage is applied to the selected word line.

10. The semiconductor memory device according to claim 7, wherein the write operation for the selected memory cell is performed with applying a write voltage to the selected word line while the first and second select gate transistors are driven to be on and off, respectively; and applying pass voltage to non-selected word lines, which turns on memory cells without regard to cell data, and wherein the precharge operation of the selected bit line for the verify-read operation is started simultaneously with starting of the discharge of the selected word line after turning off the first select gate transistor.

11. The semiconductor memory device according to claim 7, wherein, the write operation for the selected memory cell is performed with applying a write voltage to the selected word line while the first and second select gate transistors are driven to be on and off, respectively; applying a write allowing voltage or write inhibiting voltage to the selected bit line in accordance with write data; applying the write inhibiting voltage to non-selected bit lines; and applying a pass voltage to non-selected word lines, which turns of memory cells without regard to cell data, and wherein the precharge operation of the selected bit line for the verify-read operation is started simultaneously with starting of discharge of the selected word line after turning off the first select gate transistor prior to the selected word line discharge, and after discharging the selected and non-selected bit lines just before starting discharge of the selected word line.

12. The semiconductor memory device according to claim 7, wherein said read/write circuit comprises:

a row decoder configured to selectively drive the word lines in said memory cell array; and a sense amplifier circuit disposed to be coupled to the bit lines of said memory cell array to perform a data read operation, and hold write data therein, thereby applying control voltages to the bit lines in accordance with the write data, said sense amplifier circuit having plural sense amplifiers, to each of which one of adjacent two bit lines is selectively coupled, and wherein the write operation is performed for plural memory cells simultaneously, which are selected by a selected word line and plural bit lines.

13. An electric card equipped with a semiconductor memory device, said device comprising:

a memory cell array having a plurality of word lines and a plurality of bit lines, which cross each other, and electrically rewritable and non-volatile memory cells disposed at crossings thereof;

a read/write circuit configured to write data into a selected memory cell with applying a write voltage to a selected word line, and detect a discharge state of a selected bit line to read data of the selected memory cell after having precharged the selected bit line to a certain voltage; and a controller configured to control said read/write circuit to execute a write sequence by repeat of a write operation and a verify-read operation for the selected memory cell, said controller being configured to start a precharge operation of the selected bit line for the verify-read operation prior to the ending time of the write operation in the write sequence.

14. An electric device comprising:

a card interface;

a card slot connected to said card interface; and an electric card defined in claim 13 and electrically connectable to said card slot.

15. A method of controlling a write sequence of a semiconductor memory device with a memory cell array having a plurality of word lines and a plurality of bit lines, which cross each other, and electrically rewritable and non-volatile memory cells disposed at crossings thereof, comprising;

writing data into a selected memory cell in said memory cell array; and verify-reading data of the selected memory cell with a precharge operation for precharging a selected bit line coupled to the selected memory cell, a discharge operation for discharging the selected bit line, and a data sensing operation for detecting the discharge state of the selected bit line, wherein the precharge operation of the selected bit line for the verify-reading operation is started prior to the ending time of the writing operation.

16. The method according to claim 15, wherein, said memory cell array further includes select gate transistors disposed for coupling the memory cells to the corresponding bit lines, and wherein the write operation for the selected memory cell is performed with applying a write voltage to the selected word line while the select gate transistors are driven to be on, and wherein the precharge operation of the selected bit line for the verify-read operation is started after turning off the select gate transistors, and while the write voltage is applied to the selected word line.

17. The method according to claim 15, wherein, said memory cell array further includes select gate transistors disposed for coupling the memory cells to the corresponding bit lines, and wherein the write operation for the selected memory cell is performed with: applying a write voltage to the selected word line while the select gate transistors are driven to be on; applying a write allowing voltage or write inhibiting voltage to the selected bit line in accordance with write data; and applying the write inhibiting voltage to a non-selected bit line, and wherein the precharge operation of the selected bit line for the verify-read operation is started after turning off the select gate transistors and simultaneously discharging the selected and non-selected bit lines, and while the write voltage is applied to the selected word line.

18. The method according to claim 15, wherein said memory cell array further includes select gate transistors disposed for coupling the memory cells to the corresponding bit lines, and wherein the write operation for the selected memory cell is performed with applying a write voltage to the selected word line while the select gate transistors are driven to be on, and wherein the precharge operation of the selected bit line for the verify-read operation is started simultaneously with starting the discharge of the selected word line after turning off the select gate transistors.

19. The method according to claim 15, wherein, said memory cell array further includes select gate transistors disposed for coupling the memory cells to the corresponding bit lines, and wherein the write operation for the selected memory cell is performed with applying a write voltage to the selected word line while the select gate transistors are driven to be on; applying a write allowing voltage or write inhibiting voltage to the selected bit line in accordance with write data; and applying the write inhibiting voltage to a non-selected bit line, and wherein the precharge operation of the selected bit line for the verify-read operation is started simultaneously with starting discharge of the selected word line after turning off the select gate transistors prior to the selected word line discharge, and after discharging the selected and non-selected bit lines just before starting discharge of the selected word line.

* * * * *